Aug. 21, 1956 C. E. BERRY 2,760,011
FREQUENCY SEPARATING APPARATUS
Filed Oct. 25, 1954 2 Sheets-Sheet 1

INVENTOR.
CLIFFORD E. BERRY
BY
Christie, Parker & Hale
ATTORNEYS

INVENTOR.
CLIFFORD E. BERRY

BY Christie, Parker & Hale

ATTORNEYS

United States Patent Office 2,760,011

Patented Aug. 21, 1956

2,760,011

FREQUENCY SEPARATING APPARATUS

Clifford E. Berry, Altadena, Calif., assignor, by mesne assignments, to Consolidated Electrodynamics Corporation, Pasadena, Calif., a corporation of California Application October 25, 1954, Serial No. 464,387

6 Claims. (Cl. 179—171)

This invention relates to apparatus for separating selected frequency components of electrical signals into separate electrical channels.

The present application is a continuation-in-part of my application Serial Number 453,788, which was filed on September 2, 1954.

In many instances it is desirable to separate certain frequency components of electrical signals into separate electrical channels. By way of example, some sound reproduction systems employ two or more loud speakers, with each speaker serving to reproduce signals having a frequency range which is different from that reproduced by the other speakers. The electrical signals which are applied to the individual speakers should be separated into the frequency components which the speaker is arranged to reproduce.

In another example, it is desirable in amplifiers which operate over a wide band of frequencies to arrange the amplification system to amplify the high and low frequency components separately in order to provide the required frequency range. With such an arrangement, the components of the input signal are separated into high and low frequency components. These components are amplified in separate channels, and then they may be combined to provide an amplified version of the input signal.

Usually it is desirable that the frequency separation be achieved without producing unequal phase shifts in the component frequencies in order to avoid distortion of signals having components which are composed of a plurality of frequencies. The apparatus should be arranged so that transmission through the system is represented by a real number at all frequencies.

In accordance with the present invention, such frequency separation is effected by providing a frequency-responsive network for providing in one channel the frequency components which the frequency-responsive network passes, and by providing a subtraction circuit which is responsive to the input signal and to the signal produced at the output of the frequency-responsive network for providing in a second channel all of the frequency components of the input signal except those which are passed by the frequency-responsive network. The frequency-responsive network may have any desired frequency response.

If the frequency-responsive network is a high-pass filter, the high frequency components of the input signal are provided at its output, and the low frequency components of the input circuit are provided at the output of the subtraction circuit. If the frequency-responsive network is a low-pass filter, the low frequency components are provided at the output circuit of the low-pass filter and the high frequency components are provided at the output of the subtraction circuit.

The invention is explained in detail with reference to the drawings, in which.

Figure 1:
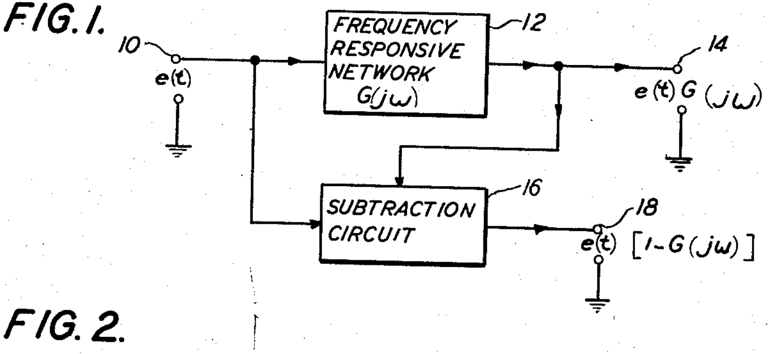
Fig. 1 shows the frequency separating apparatus of the invention.

With reference to Fig. 1, an input circuit 10 is provided for receiving signals which are to be separated into different frequency components. A frequency-responsive network 12 is coupled to the input circuit and it serves to pass selected frequency components of the input signal to an output circuit 14 while providing high attenuation for the other frequency components of the input signal.

A subtraction circuit 16 has one input coupled to the input circuit 10 to receive the input signal and it has its other input coupled to the output of the frequency-responsive network so that it provides at its output circuit 18 the frequency components of the input signal less the frequency components which are passed by the frequency-responsive network.

The frequency-responsive network may be arranged to pass any desired frequency components of the input signal. For example, the frequency-responsive network may be a band-pass, a low-pass or a high-pass arrangement.

If the transmission characteristic of the frequency-responsive network is denoted by $G(j\omega)$, which is an arbitrary complex function, and the signal voltage is denoted by $e(t)$, then the signal produced at the output circuit 14 is $e(t)\ G(j\omega)$, and the signal produced at the ouput circuit 18 is $e(t)\ [1-G(j\omega)]$.

It will be apparent that the output circuit 14 may be omitted if it is desired to provide a single output channel having the frequency components of the input signal less the frequency components which are passed by the frequency-responsive network.

By employing a high or a low-pass filter as the frequency-responsive network, the apparatus of Fig. 1 may be employed to separate an input signal into high and low frequency components.

Figure 2:
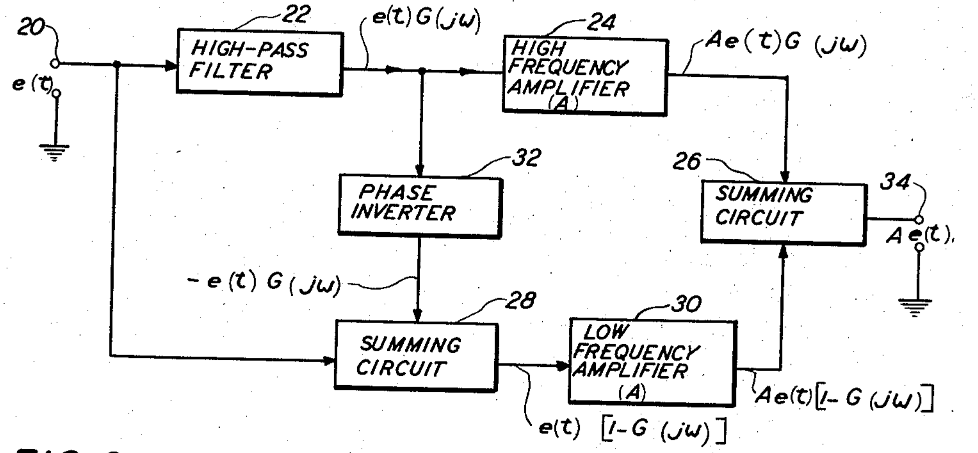
Fig. 2 shows how the frequency separating apparatus may be employed in a wide-band amplification system.

Fig. 2 shows a wide-band amplification system wherein the high and low frequency components are amplified separately in order to provide the desired frequency range. The signal to be divided into high and low frequency components is applied to an input circuit 20. The high frequency components of the signals are conveyed through a high-pass filter 22 and a high frequency amplifier 24 to a summing circuit 26.

The other channel of the amplification arrangement comprises a summing circuit 28 and a low frequency amplifier 30. The signals at the input circuit 20 are applied to the summing circuit 28 and subtraction of the high frequency components is effected by applying the signal produced at the output of the high-pass filter 22 through a phase inverter 32 to the summing circuit 28. Thus, the signal produced at the output of the summing circuit 28 is the signal which is applied to the input circuit 20 with the high frequency components which are provided at the output of the high-pass filter subtracted from the input signal.

The phase inversion which is provided by the phase inverter 32 usually does not require a separate circuit. It may be effected in the coupling between the high-pass filter 22 and the input circuit of the summing circuit 28. If transformers are employed, the phase inversion may be effected by reversing the connections to one winding of the transformer.

The high frequency amplifier 24 and the low frequency amplifier 30 should have flat gain regions which overlap, and they should have amplifications which are substantially the same in their flat gain regions. The flat gain response of the high frequency amplifier 24 should extend to a frequency which is lower than the frequency at which the high-pass filter 22 begins to attenuate the signal which it conveys. The flat gain response of the low frequency amplifier 30 should extend to a frequency which is higher than the frequency at which the high-pass filter 22 begins to attenuate the signal which it conveys. Thus, the cut-off frequency for the high-pass filter should fall within the frequency range in which the flat gain regions of the two amplifiers overlap.

The signals provided at the outputs of the two amplifiers are applied to the summing circuit 26, which adds the two amplified signals together to provide an amplified version of the input signal at the output circuit 34.

If the transmission characteristic of the high-pass filter 12 is denoted by $G(j\omega)$, which is an arbitrary complex function, and the signal voltage is denoted by $e(t)$, then the voltage at the output of the phase inverter is $-e(t)G(j\omega)$. This voltage added to the input signal $e(t)$ gives $e(t)[1-G(j\omega)]$ as the input signal to the low frequency amplifier 30.

If each amplifier has a gain of A, which is the real number within the pass band of each amplifier, the signals produced at the outputs of the two amplifiers are $Ae(t)G(j\omega)$ for the high frequency and $Ae(t)[1-G(j\omega)]$ for the low frequency channel. When these two signals are summed at the output circuit, the output signal is $Ae(t)$. Thus, the output signal is an amplified version of the input signal.

Figure 3:
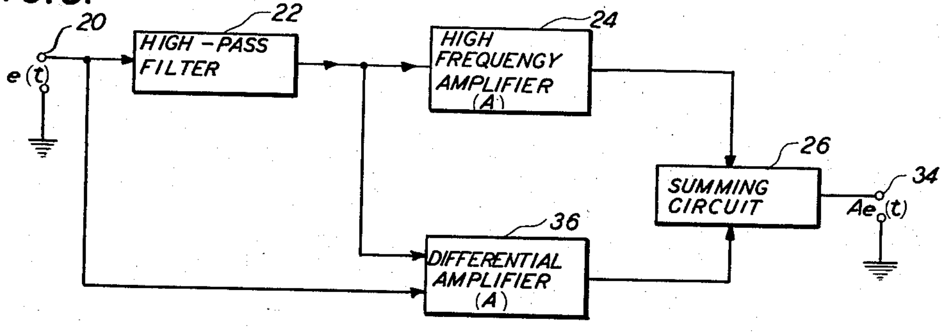
Fig. 3 shows a modification of the apparatus of Fig. 2.

Fig. 3 shows a modification of the apparatus of Fig. 2 wherein subtraction is effected by a differential amplifier 36 instead of by the phase inverter 32 and the summing circuit 28 of Fig. 2. The signal which is applied to the input circuit 20 is applied to the differential amplifier, and the signal which is produced at the output of the high-pass filter is also applied to the differential amplifier. The differential amplifier serves as a subtraction circuit so that the output signal which it produces is the same as that produced by the low frequency amplifier 30 of the apparatus of Fig. 2.

Figure 4:
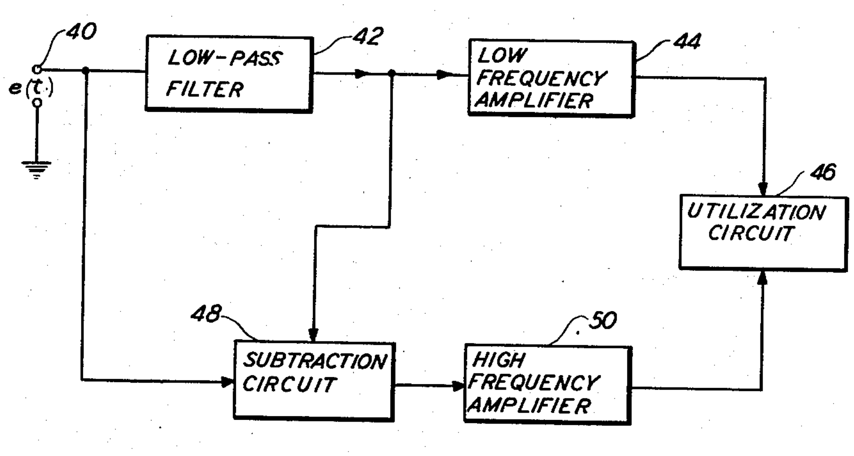
Fig. 4 shows how a low-pass filter may be employed instead of the high-pass filter illustrated in Fig. 2.

Fig. 4 shows how a low-pass filter may be employed to separate frequency components into high and low frequency components. An input circuit 40 is provided for receiving the signals to be separated. The low frequency components of the signal are conveyed through a low-pass filter 42 and a low frequency amplifier 44 to a utilization circuit 46.

The input signal and the signal provided at the output of the low-pass filter 42 are applied to a subtraction circuit 48. Thus, the signal which is produced at the output of the subtraction circuit 48 is the signal which is applied to the input circuit 40 with the low frequency signal of the low frequency channel subtracted from the input signal. The high frequency components which are provided at the output of the subtraction circuit are applied through a high frequency amplifier 50 to the utilization circuit 46.

If the output signals of the low and high frequency amplifiers 44 and 50 are to be summed to provide an amplified version of the input signal, the low frequency amplifier 44 and the high frequency amplifier 50 should have flat gain regions which overlap and they should have amplifications which are substantially the same in their flat gain regions. The cut-off frequency for the low-pass filter 42 should fall within the frequency range in which the flat gain regions of the two amplifiers overlap.

Conventional circuits may be employed in the various blocks shown in Figs. 1 to 4 of the drawings. Preferably, a carrier-type direct current amplifier is employed as the low frequency amplifier in the apparatus of Figs. 2 to 4 if the amplification system is to be employed with very low frequency signals or with direct current because such an amplifier provides amplification which is substantially free from drift.

Figure 5:
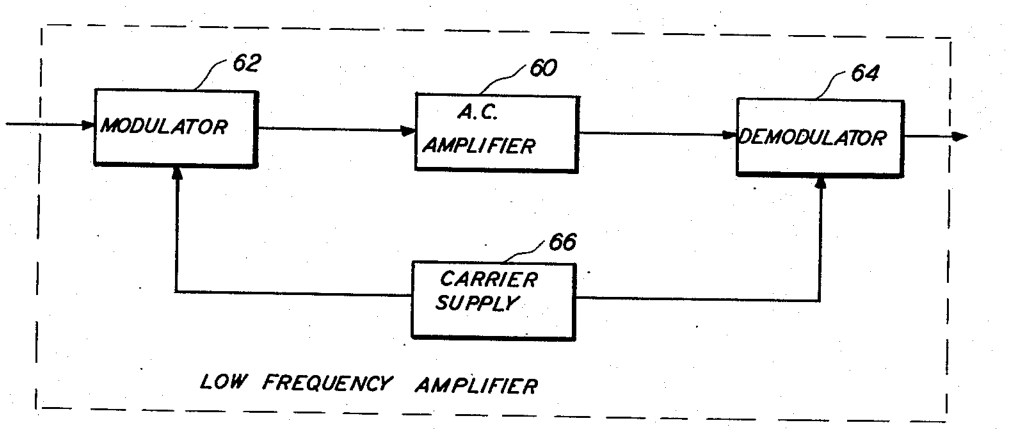
Fig. 5 shows a carrier-type amplifier which may be employed as the low frequency amplifier of the apparatus shown in Figs. 2, 3 and 4.

Fig. 5 illustrates one suitable type carrier amplifier.

It comprises a conventional A. C. amplifier 60 having a modulator 62 coupled to its input and having a demodulator 64 coupled to its output. A carrier supply 66 actuates the modulator and the demodulator in synchronism. Ordinarily, the modulator and the demodulator are synchronous choppers which are actuated by a source of alternating current which is the carrier suply 66.

The amplification systems of Figs. 2 and 3 show arrangements wherein the high and low frequency components are summed to provide an amplified version of the input signal. By way of example, such systems may be employed to drive a string galvanometer which requires a large amount of power.

The amplification system of Fig. 4 may be arranged to sum the high and low frequency components by employing a summing arrangement, as illustrated in Figs. 2 and 3, as the utilization circuit.

Also, the outputs of the high and low frequency amplification channels of the systems of Figs. 2 and 3 may be applied to any suitable utilization circuit instead of being summed.

In the embodiments of Figs. 2, 3 and 4 the high and low frequency amplifiers may have different gains if it is desired to amplify the separated frequency components different amounts.

I claim:

1. Wide band amplification apparatus comprising an input circuit for receiving signals to be amplified, an amplifier for amplifying low frequency components, an amplifier for amplifying high frequency components, frequency-responsive means coupled between said input circuit and the input of one of the amplifiers for passing frequency components which the amplifier is adapted to amplify, a signal conveying channel coupled between said input circuit and the input of the other amplifier and having a frequency response adapted to convey all of the frequency components of signals applied to the input circuit to the input of said other amplifier, subtracting means coupled to the output of the frequency-responsive means and to said other amplifier for subtracting the frequency components which are passed by the frequency-responsive means from the signal which is conveyed through the signal conveying channel to said other amplifier, and means coupled to the two amplifiers for combining their output signals to provide an amplified version of an input signal.

2. The apparatus of claim 1, wherein the frequency-responsive means is a high-pass filter.

3. The apparatus of claim 1 wherein the frequency-responsive means is a low-pass filter.

4. The apparatus of claim 1 wherein the subtracting means comprises a summing circuit having one of its inputs coupled to said input circuit for receiving signals to be amplified and having its other input coupled to the output of the frequency-responsive means, and phase-inverter means located in one of the input circuits for the summing circuit for causing the signals which are summed to cancel one another.

5. The apparatus of claim 1 wherein the subtracting means comprises a differential amplifier having one of its inputs coupled to said input circuit for receiving signals to be amplified and having its other input coupled to the output of the frequency-responsive means.

6. Wide band amplification apparatus comprising an input circuit for receiving signals to be amplified, a direct current amplifier for amplifying low frequency components, an amplifier for amplifying high frequency components, the two amplifiers having flat gain regions which overlap and having amplifications which are substantially the same in their flat gain regions, frequency-responsive means coupled between said input circuit and the input of one of the amplifiers for passing frequency components which the amplifier is adapted to amplify, means coupling the input of the other amplifier to said input circuit, means coupled between the output of the frequency-responsive means and the input of said other amplifier for subtracting the frequency components which are passed by the frequency-responsive means from the signal which is applied to the input of said other amplifier, and means coupled to the two amplifiers for combining their output signals to provide an amplified version of an input signal.

References Cited in the file of this patent

UNITED STATES PATENTS

| | | |
|---|---|---|
| 2,255,642 | Artzt | Sept. 9, 1941 |
| 2,379,055 | Abraham | June 26, 1945 |